United States Patent
Wang et al.

(10) Patent No.: US 11,950,484 B2
(45) Date of Patent: Apr. 2, 2024

(54) DISPLAY PANEL AND MANUFACTURING METHOD THEREFOR, AND ELECTRONIC DEVICE AND IMAGING METHOD THEREFOR

(71) Applicant: BOE TECHNOLOGY GROUP CO., LTD., Beijing (CN)

(72) Inventors: Pengpeng Wang, Beijing (CN); Haisheng Wang, Beijing (CN); Xiaoliang Ding, Beijing (CN); Yangbing Li, Beijing (CN); Xueyou Cao, Beijing (CN); Ping Zhang, Beijing (CN); Likai Deng, Beijing (CN); Yubo Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 536 days.

(21) Appl. No.: 17/280,366

(22) PCT Filed: Jul. 23, 2020

(86) PCT No.: PCT/CN2020/103748
§ 371 (c)(1),
(2) Date: Mar. 26, 2021

(87) PCT Pub. No.: WO2021/013216
PCT Pub. Date: Jan. 28, 2021

(65) Prior Publication Data
US 2021/0385360 A1    Dec. 9, 2021

(30) Foreign Application Priority Data
Jul. 23, 2019 (CN) .......................... 201910667668.4

(51) Int. Cl.
*H10K 59/65* (2023.01)
*G09F 9/30* (2006.01)
(Continued)

(52) U.S. Cl.
CPC ............... *H10K 59/65* (2023.02); *G09F 9/30* (2013.01); *H04N 5/33* (2013.01); *H04N 23/54* (2023.01);
(Continued)

(58) Field of Classification Search
CPC .. H10K 59/65; G09F 9/30; H04N 5/33; G02F 2201/083
(Continued)

(56) References Cited

U.S. PATENT DOCUMENTS

| 10,665,631 B1 | 5/2020 | Cai et al. |
| 2008/0252618 A1 | 10/2008 | Chung et al. |

(Continued)

FOREIGN PATENT DOCUMENTS

| CN | 101196690 | 6/2008 |
| CN | 103597533 | 2/2014 |

(Continued)

OTHER PUBLICATIONS

Chinese First Office Action (w/ English translation) for corresponding CN Application No. 201910667668.4, 23 pages.
(Continued)

*Primary Examiner* — Quoc D Hoang
(74) *Attorney, Agent, or Firm* — Dority & Manning, PA

(57) ABSTRACT

A display panel includes a display layer, a photosensitive layer and an infrared mask. The display layer is configured to display an image, the display layer has light-transmitting portions, and the light-transmitting portions are configured to transmit infrared light. The photosensitive layer is disposed on a side of the display layer. The infrared mask is disposed on a side of the photosensitive layer proximate to the display layer, the infrared mask has hollowed-out regions, the hollowed-out regions are configured to make the infrared mask have a preset pattern, and a region in the
(Continued)

infrared mask except the hollowed-out regions is configured to prevent transmission of the infrared light. The photosensitive layer is configured to receive infrared light passing though the hollowed-out regions and the light-transmitting portions, and convert the infrared light into an image signal.

16 Claims, 9 Drawing Sheets

(51) Int. Cl.
    *H04N 5/33*     (2023.01)
    *H04N 23/54*     (2023.01)
    *G02F 1/1333*     (2006.01)

(52) U.S. Cl.
    CPC ...... *G02F 1/1333* (2013.01); *G02F 2201/083* (2013.01); *G02F 2201/58* (2013.01)

(58) Field of Classification Search
    USPC .......................................................... 257/40
    See application file for complete search history.

(56) References Cited

U.S. PATENT DOCUMENTS

| | | |
|---|---|---|
| 2015/0331320 A1 | 11/2015 | Park et al. |
| 2016/0212415 A1 | 7/2016 | Cho et al. |
| 2019/0055375 A1* | 2/2019 | Choi ................. H01L 27/14621 |
| 2019/0305034 A1* | 10/2019 | Hsieh ...................... G06F 3/044 |
| 2020/0349334 A1 | 11/2020 | Li et al. |
| 2021/0234114 A1 | 7/2021 | Li et al. |

FOREIGN PATENT DOCUMENTS

| | | |
|---|---|---|
| CN | 103838080 | 6/2014 |
| CN | 107368822 | 11/2017 |
| CN | 107592444 | 1/2018 |
| CN | 108932024 | 12/2018 |
| CN | 109508577 | 3/2019 |
| CN | 109508578 | 3/2019 |
| CN | 110379311 | 10/2019 |
| JP | 2017049469 | 3/2017 |
| JP | 2017167203 | 9/2017 |

OTHER PUBLICATIONS

Chinese Second Office Action (w/ English translation) for corresponding CN Application No. 201910667668.4, 21 pages.

PCT International Search Report (w/ English translation) for corresponding PCT Application No. PCT/CN2020/103748, dated Oct. 30, 2020, 8 pages.

\* cited by examiner

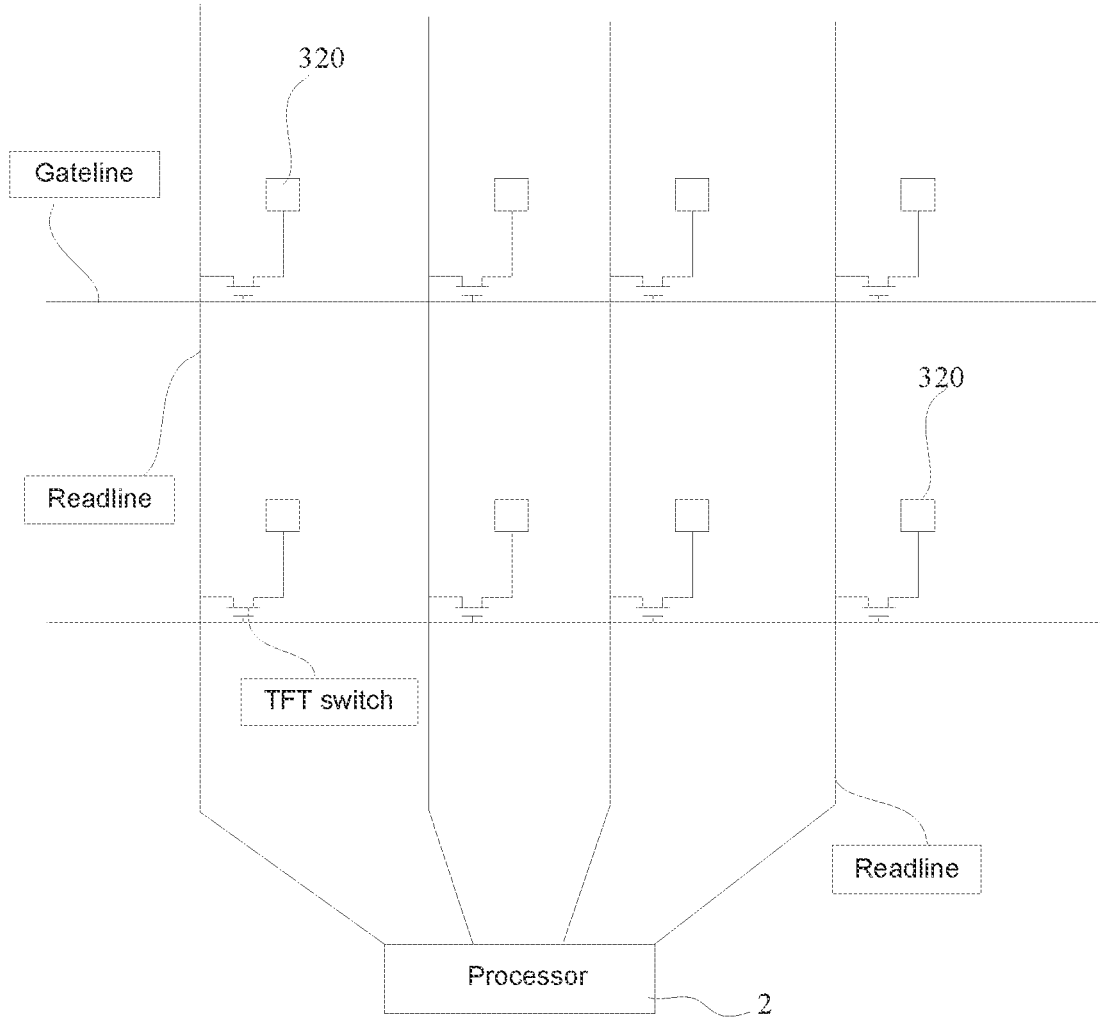

FIG. 17

Power is supplied to the photosensitive layer in the display panel, so that the photosensitive layer receives the infrared light emitted by the object to be photographed and passing through the hollowed-out regions and the light-transmitting portions, and converts the infrared light into an image signal and outputs the image signal — S100

The image data of the object to be photographed is determined according to the image signal and the image data of the preset pattern — S200

FIG. 18

DISPLAY PANEL AND MANUFACTURING METHOD THEREFOR, AND ELECTRONIC DEVICE AND IMAGING METHOD THEREFOR

CROSS-REFERENCE TO RELATED APPLICATIONS

This application is a national phase entry under 35 USC 371 of International Patent Application No. PCT/CN2020/103748 filed on Jul. 23, 2020, which claims priority to Chinese Patent Application No. 201910667668.4, filed with the Chinese Patent Office on Jul. 23, 2019, titled "DISPLAY PANEL, ELECTRONIC DEVICE, AND MANUFACTURING METHOD AND IMAGING METHOD FOR DISPLAY PANEL", which are incorporated herein by reference in their entirety.

TECHNICAL FIELD

The present disclosure relates to the field of display technologies, and in particular, to a display panel and a manufacturing method therefor, and an electronic device and an imaging method therefor.

BACKGROUND

In recent years, with the development of science and technology, an era of Internet of Things in which everything is interconnected is coming. An electronic device (e.g., a mobile phone), as a data acquisition platform with extremely high popularity, is increasingly required to be integrated with various sensors, and various needs of people are met by combining data acquisition by the sensors and display of a display panel.

Still taking an example in which the electronic device is the mobile phone, an important data acquisition device in the mobile phone is a camera. At present, cameras used in mobile phones all have complex and precise optical lenses (composed of multiple lenses). Since volumes of the optical lenses are difficult to reduce, a lensless imaging solution of reducing or even removing the optical lenses has always been a focus and difficulty of miniaturization of the cameras.

SUMMARY

In one aspect, a display panel is provided. The display panel includes a display layer, a photosensitive layer and an infrared mask. The display layer is configured to display an image, the display layer has light-transmitting portions, and the light-transmitting portions are configured to transmit infrared light. The photosensitive layer is disposed on a side of the display layer. The infrared mask is disposed on a side of the photosensitive layer proximate to the display layer, the infrared mask has hollowed-out regions, and the hollowed-out regions are configured to make the infrared mask have a preset pattern, and a region in the infrared mask except the hollowed-out regions is configured to prevent transmission of infrared light. The photosensitive layer is configured to receive infrared light passing though the hollowed-out regions and the light-transmitting portions, and convert the infrared light into an image signal.

In some embodiments, orthogonal projections of the hollowed-out regions on the display layer are located within regions occupied by the light-transmitting portions.

In some embodiments, the photosensitive layer is disposed on a side of the display layer away from a display side of the display layer.

In some embodiments, the infrared mask is disposed on a side of the display layer away from the photosensitive layer, or the infrared mask is disposed between the display layer and the photosensitive layer.

In some embodiments, the display layer includes a driving circuit layer and a light-emitting layer that are stacked, the light-emitting layer includes a plurality of pixel units, and the driving circuit layer is coupled to the plurality of pixel units and is configured to drive the plurality of pixel units to emit light.

In some embodiments, the light-emitting layer is closer to the photosensitive layer than the driving circuit layer. The light-emitting layer includes a first electrode layer, a light-emitting functional layer and a second electrode layer that are sequentially arranged in a direction gradually proximate to the photosensitive layer, the second electrode layer is capable of reflecting light, and openings are formed in regions occupied by the light-transmitting portions in the second electrode layer. The display panel further includes an encapsulation substrate, the encapsulation substrate is disposed on a side of the photosensitive layer away from the display layer.

In some embodiments, the photosensitive layer includes photosensitive layer driving circuits and a plurality of photosensitive elements, and the plurality of photosensitive elements are coupled to the photosensitive layer driving circuits. An orthographic projection of each photosensitive element on the light-emitting layer is located between two adjacent pixel units; or each pixel unit includes a plurality of sub-pixel units, and the orthographic projection of each photosensitive element on the light-emitting layer is located between two adjacent sub-pixel units.

In some embodiments, the plurality of pixel units are arranged in an array, and the plurality of photosensitive elements are arranged in an array.

In some embodiments, the infrared mask is configured to support the display layer; or, the display panel further includes a transparent substrate, and the substrate is configured to support the display layer.

In some embodiments, the display panel further includes the substrate, a driving circuit layer, and a light-emitting layer, the substrate is disposed on a side of the driving circuit layer away from the light-emitting layer; and the substrate has light-transmitting holes, an orthogonal projection of each light-transmitting hole on the display layer is within a region occupied by a corresponding light-transmitting portion, and an orthogonal projection of each photosensitive element on the substrate is within a region where a corresponding light-transmitting hole is located.

In some embodiments, the display panel further includes a filter film; and the filter film is disposed between the photosensitive layer and the display layer, and is used to filter out visible light emitted by the display layer.

In some embodiments, the infrared mask is a glass layer, a metal layer or an organic material layer.

In some embodiments; photosensitive elements are complementary metal oxide semiconductor sensors, charge-coupled devices, or organic photosensitive sensors.

In another aspect, an electronic device is provided. The electronic device includes a processor and the above display panel. The processor is coupled to the photosensitive layer, and is used to determine image data of an object to be photographed emitting infrared light according to the image signal and image data of the preset pattern.

In yet another aspect, a method for manufacturing a display panel is provided. The method includes: forming a display layer, the display layer being configured to display an image, the display layer having light-transmitting portions configured to transmit infrared light; forming a photosensitive layer on a side of the display layer; and forming an infrared mask on a side of the photosensitive layer proximate to the display layer, the infrared mask having hollowed-out regions configured to make the infrared mask have a preset pattern, and a region in the infrared mask except the hollowed-out regions are configured to prevent transmission of the infrared light; and the photosensitive layer is configured to receive infrared light passing through the hollowed-out regions in the infrared mask and the light-transmitting portions, and convert the infrared light into an image signal.

In some embodiments, the display panel further includes an encapsulation substrate, forming the photosensitive layer on a side of the display layer includes: forming the photosensitive layer on the encapsulation substrate, the photosensitive layer including photosensitive layer driving circuits and a plurality of photosensitive elements, and the photosensitive layer driving circuits being coupled to the plurality of photosensitive elements; and attaching the encapsulation substrate closer to the display layer, the photosensitive element is closer to the display layer than the encapsulation substrate, and an orthogonal projection of each photosensitive element on the display layer is within a region where a corresponding light-transmitting portion is located.

In some embodiments, in a case where each photosensitive element is a complementary metal oxide semiconductor sensor or a charge-coupled device, forming the photosensitive layer on the encapsulation substrate includes: forming the photosensitive layer on a wafer; transferring the photosensitive layer to a surface of a stamp; and transferring the photosensitive layer on the surface of the stamp to the encapsulation substrate.

In some embodiments, each photosensitive element is an organic photosensitive sensor, forming the photosensitive layer on the encapsulation substrate includes: forming the photosensitive layer driving circuits on the encapsulation substrate; forming the plurality of photosensitive elements on the encapsulation substrate on which the photosensitive layer driving circuits have been formed, each photosensitive element including at least one electrode layer and an organic photosensitive layer.

In yet another aspect, an imaging method for the above electronic device is provided. The imaging method includes: supplying power to the photosensitive layer in the display panel, so that the photosensitive layer receives infrared light emitted by the object to be photographed and passing through the hollowed-out regions and the light-transmitting portions, and converts the infrared light into an image signal and outputs the image signal; and determining the image data of the object to be photographed according to the image signal and the image data of the preset pattern.

BRIEF DESCRIPTION OF THE DRAWINGS

In order to explain technical solutions in the present disclosure more clearly, accompanying drawings to be used in some embodiments of the present disclosure will be briefly introduced below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals to which the embodiments of the present disclosure relate.

FIG. 17 is a schematic diagram showing a circuit principle of a photosensitive layer, in accordance with some embodiments; and FIG. 18 is a flow diagram of an imaging method for an electronic device, in accordance with some embodiments.

DETAILED DESCRIPTION

Figure 1:
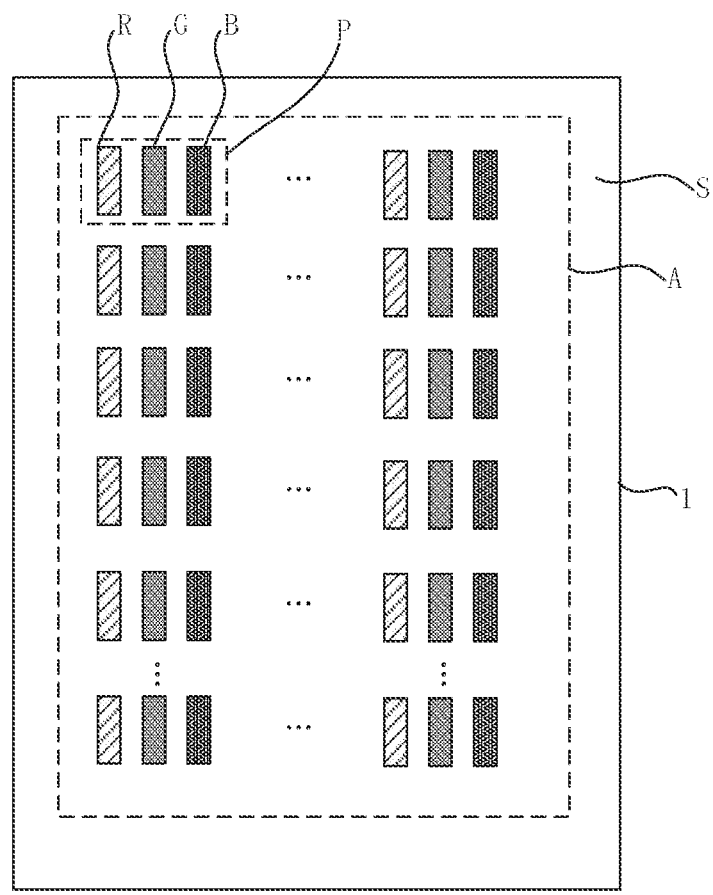
FIG. 1 is a top view illustrating a structure of a display panel, in accordance with some embodiments.

Technical solutions in some embodiments of the present disclosure will be described below clearly and completely with reference to accompanying drawings. Obviously, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, that is, "including, but not limited to". In the description, the terms such as "one embodiment", "some embodiments", "exemplary embodiments", "example", "specific example", or "some examples"

are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined as "first" and "second" may explicitly or implicitly include one or more of the features. In the description of the embodiments of the present disclosure, the term "a plurality of" means two or more unless otherwise specified.

In the description of some embodiments, the terms "coupled" and "connected" and their extensions may be used. For example, the term "connected" may be used in the description of some embodiments to indicate that two or more components are in direct physical or electric contact with each other. For another example, the term "coupled" may be used in the description of some embodiments to indicate that two or more components are in direct physical or electric contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B, and C" has a same meaning as the phrase "at least one of A, B, or C", and they both include the following combinations of A, B, and C: only A, only B, only C, a combination of A and B, a combination of A and C, a combination of B and C, and a combination of A, B, and C.

The phrase "A and/or B" includes the following three combinations: only A, only B, and a combination of A and B.

As used herein, the term "if" is optionally construed as "when" or "in a case where" or "in response to determining" or "in response to detecting", depending on the context. Similarly, the phrase "if it is determined" or "if [a stated condition or event] is detected" is optionally construed as "in a case where it is determined" or "in response to determining" or "in a case where [the stated condition or event] is detected" or "in response to detecting [the stated condition or event]", depending on the context.

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. Thus; variations in shapes relative to the accompanying drawings due to, for example, manufacturing techniques and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a curved feature, Therefore, the regions shown in the accompanying drawings are schematic in nature and their shapes are not intended to show actual shapes of the regions in a device and are not intended to limit the scope of the exemplary embodiments.

At present; with the development of smart electronic devices (e.g., mobile phones), screens (i.e., display panels) may be considered to be the most indispensable terminal devices for people. An electronic device formed by integrating a screen and various sensors may be used as both an output terminal and an input terminal for information; and may also be used as an input terminal or an output terminal only.

Some embodiments of the present disclosure provide a display panel integrated with lensless image capture sensor(s). As shown in FIG. 1, the display panel 1 has an active area (abbreviated as AA) A and a peripheral area S located outside the active area A. As shown in FIG. 1, these embodiments are described by taking an example in which the peripheral area S surrounds the active area A.

Figure 2:
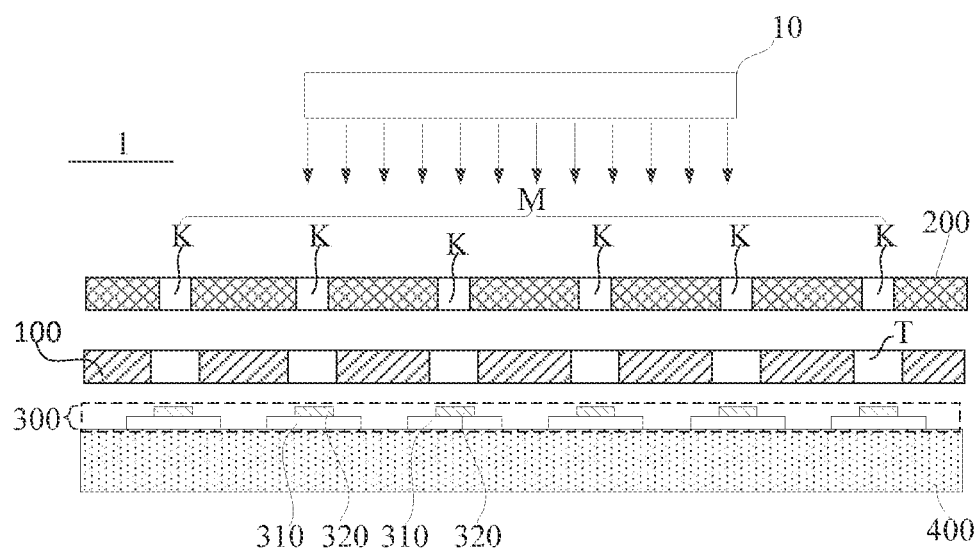
FIG. 2 is a sectional view illustrating a structure of a display panel, in accordance with some embodiments.
Figure 3:
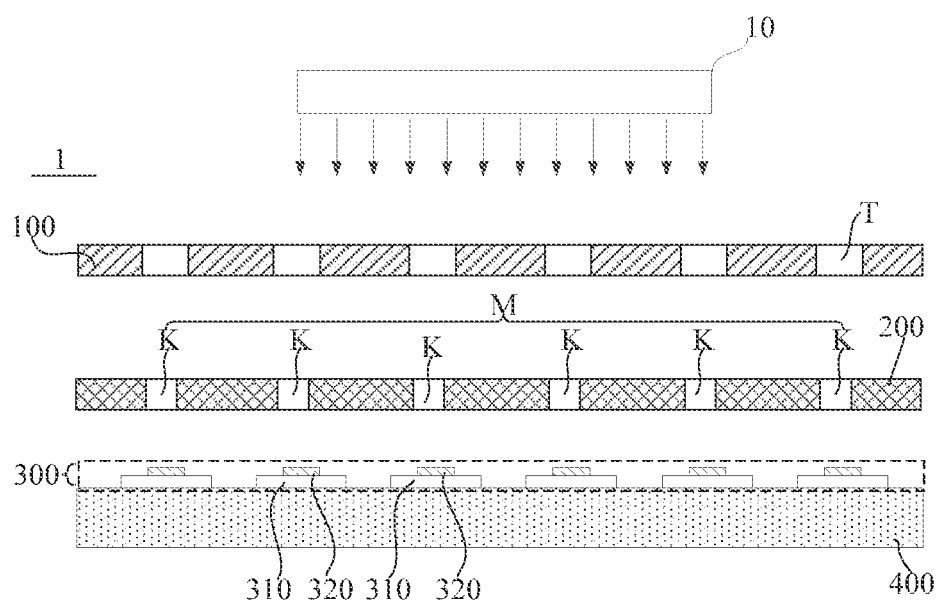
FIG. 3 is a sectional view illustrating a structure of a display panel, in accordance with some other embodiments.

As shown in FIGS. 1, 2 and 3, the display panel 1 includes a display layer 100, a photosensitive layer 300 and an infrared mask 200. The display layer 100 is configured to display an image, and may be disposed in the active area A. The display layer 100 has light-transmitting portions T, and the light-transmitting portions T are configured to transmit infrared light. The photosensitive layer 300 is disposed on a side of the display layer 100. The photosensitive layer 300 may also be located in the active area A, and may also extend to the peripheral area S. The infrared mask 200 is disposed on a side of the photosensitive layer 300 proximate to the display layer 100. The infrared mask 200 may also be located in the active area A, and may also extend to the peripheral area S. The infrared mask 200 has hollowed-out regions K. The hollowed-out regions K are configured to make the infrared mask 200 have a preset pattern NI, and a region in the infrared mask except the hollowed-out regions is configured to prevent transmission of infrared light. The photosensitive layer 300 is configured to receive infrared light passing through the hollowed-out regions K and the light-transmitting portions T, and convert the infrared light into an image signal.

It can be seen from the above that, the display layer 100 and the infrared mask 200 are disposed on a same side of the photosensitive layer 300, the infrared light received by the photosensitive layer 300 is incident from a side of the display layer 100 and the infrared mask 200 that is away from the photosensitive layer 300, and the infrared light is emitted by an object to be photographed (which may be, e.g., an object) 10. Therefore, it can be seen that In some embodiments, the photosensitive layer 300 may be disposed on a side of the display layer 100 away from a display side of the display layer 100, that is, referring to FIGS. 2 and 3, the display side of the display layer 100 is above the display layer 100, and the photosensitive layer 300 is located below the display layer 100, so that the object to be photographed 10 is located at the display side of the display layer 100. It can be seen that in this case, a combination of the infrared mask 200 and the photosensitive layer 300 serves as a front image capture sensor, which is equivalent to a lensless camera, to achieve a selfie function of the electronic device (e.g., a mobile phone).

An imaging principle of the display panel 1 is that a special mask (i.e., the infrared mask 200 with the preset pattern) is used to replace a conventional lens to achieve indirect imaging. Theoretically, all objects to be photographed 10 are capable of emitting infrared light, intensities of infrared light emitted by different objects to be photographed 10 may be different, and intensities of infrared light emitted by different regions of a same object to be photographed 10 may also be different. During imaging, part of the infrared light emitted by the object to be photographed 10 is blocked by the non-hollowed-out region (i.e., the region in the infrared mask 200 except the hollowed-out regions K) of the infrared mask 200, the infrared light passing through the hollowed-out regions K and the light-transmitting portions T is received by the photosensitive layer 300, and the photosensitive layer 300 converts this part of infrared light into an image signal. The above process is equivalent to a process of encoding an image of the object to be photographed by using the preset pattern corresponding to the hollowed-out regions K. Subsequently, a related component (which may be, e.g., a processor) may perform processing according to the image signal and image data of the preset pattern, and finally the image of the object to be photographed 10 may be obtained. This process may be regarded as an image decoding process. The image data of the preset pattern may be pre-stored in the related component.

The preset pattern herein may be any pattern capable of encoding the image. For example, referring to FIG. 4, it is a pattern capable of encoding with 0 and 1, In order to achieve the encoding with 0 and 1, a plurality of through holes (which may also be referred to as openings) are arranged in a mask plate that prevents the transmission of the infrared light, so as to obtain the infrared mask 200. Regions occupied by the plurality of holes constitute the hollowed-out regions K. A structure of the hollowed-out regions K is not specifically limited. The hollowed-out regions K may correspond to regularly arranged holes, or may correspond to randomly arranged holes. Sizes of the plurality of holes may not be exactly the same, and shapes thereof may not be exactly the same, such as the white space portions with sizes that are not exactly the same in FIG. 4. The infrared mask 200 with the hollowed-out regions K has a specific pattern on the whole, which is referred to as the preset pattern.

In some examples, the plurality of holes are arranged in an array, that is, they are distributed in multiple rows and multiple columns. Widths W of holes in a same row (dimensions of the holes in a column direction) are the same, and lengths L of holes in a same column (dimensions of the holes in a row direction) are the same.

The above image encoding process may be regarded as a convolution matrix operation, that is, a convolution operation is performed on an image matrix of the object to be photographed by using a mask matrix to obtain a matrix corresponding to the image signal. The mask matrix is a matrix corresponding to the preset pattern, which may be composed of 0 and 1. During the convolution operation, unmasked 1-valued regions are processed, and masked 0-valued regions are not included in calculation. In these embodiments, the hollowed-out regions K of the infrared mask 200 are the 1-valued regions. Herein, taking an example in which a ratio of the hollowed-out regions K to a region defined by the infrared mask 200 is approximately ⅓, it can be understood that, the hollowed-out regions K may be used to acquire approximately ⅓ of original image data in a Fourier domain (an image), in which case with a 1-valued region as a pixel, a value of each pixel in an original image is recalculated (obtaining an intermediate image (i.e., the image signal) based on the mask matrix (also referred to as a kernel or a convolution kernel). A value in the mask matrix (the convolution kernel) defines a value at which a current pixel and adjacent pixels affect a new pixel value. Algorithmically, the image of the object to be photographed 10 itself may be mathematically abstracted into a matrix I (i.e., the image data of the object to be photographed 10), the preset pattern M may be mathematically abstracted into a matrix A (i.e., the image data of the preset pattern), and the intermediate image (i.e., the image signal) may be mathematically abstracted into a matrix Y, and there is a relational expression for the image encoding process and the image decoding process, i.e., Y=A*I. Since the image data of the preset pattern M is a known matrix, and Y is also a known matrix, by reconstructing the image signal through the above relational expression and then through inversion, the image of the object to be photographed 10 may be obtained through decoding, thereby achieving the imaging of the object to be photographed 10.

In some embodiments, the orthogonal projections of the hollowed-out regions K on the display layer 100 are located within the regions occupied by the light-transmitting portions T.

In the display panel 1 provided by these embodiments, the photosensitive layer 300 and the infrared mask 200 are located in the active area A, so that an under-screen design of the front image capture sensor is achieved, and a screen-to-body ratio can be increased compared with fabrication of a front camera in a special region. For example, the front image capture sensor may be disposed in the active area A of the display panel 1, thereby achieving a true full-screen design. In addition, by adopting a lensless design solution, lightening and thinning of the display panel can be achieved, and compared with providing multiple lenses, a structure is simple, a volume of the device can be reduced, and user experience can be improved. Furthermore, the photosensitive layer 300 is also applicable to scenarios such as face recognition, gesture recognition, and night vision imaging of the display panel 1 according to the above imaging principle.

A person skilled in the art will understand that, since the combination of the infrared mask 200 and the photosensitive layer 300 serves as the front image capture sensor to achieve the selfie function of the electronic device (e.g., the mobile phone), it is required that arrangement of the infrared mask 200 should not seriously affect normal display of the display layer 100.

According to that the display layer 100 and the infrared mask 200 are disposed on the same side of the photosensitive layer 300, there are two cases of relative positions of the three. In a first case, as shown in FIG. 2, the infrared mask 200 is disposed on a side of the display layer 100 away from the photosensitive layer 300. That is, the infrared mask 200 and the photosensitive layer 300 are disposed on both sides of the display layer 100, and the infrared mask 200 has a blocking effect on the infrared light only, and has no effect on visible light. Therefore, the normal display of the display layer 100 is not affected even if the infrared mask 200 is disposed on the side of the display layer 100 away from the photosensitive layer 300. In a second case, as shown in FIG. 3, the infrared mask 200 is disposed between the display layer 100 and the photosensitive layer 300. The infrared light sequentially passes through the display layer 100 and the infrared mask 200, and reaches the photosensitive layer 300. The infrared mask 200 does not affect the normal display of the display layer 100. Manufacturing processes of the two structures are not complicated compared with existing manufacturing processes of the display panel. The infrared mask 200 may be formed through a patterning process (which may be first forming a mask plate that prevents the transmission of the infrared light, and then forming the infrared mask 200 through etching), and existing process technology can be used to a great extent, so that the display panel can be simply manufactured, and a manufacturing cost is low.

In some embodiments, the infrared mask 200 may be a glass layer, a metal layer, an organic material layer, or the like. A specific material of the infrared mask 200 is not limited. A material of the glass layer may be cyan glass (ordinary glass or quartz glass with nickel oxide and ferrous oxide added). A material of the metal layer may be an alloy of at least one or more of aluminum, copper, and magnesium. The organic material layer may be an optical filter or the like.

The display panel 1 may be a liquid crystal display panel or a self-luminescent display panel such as an organic light-emitting diode (OLED) display panel, a quantum dot light-emitting diode (QLED) display panel, or a polymer light-emitting diode (PLED) display panel.

Figure 5:
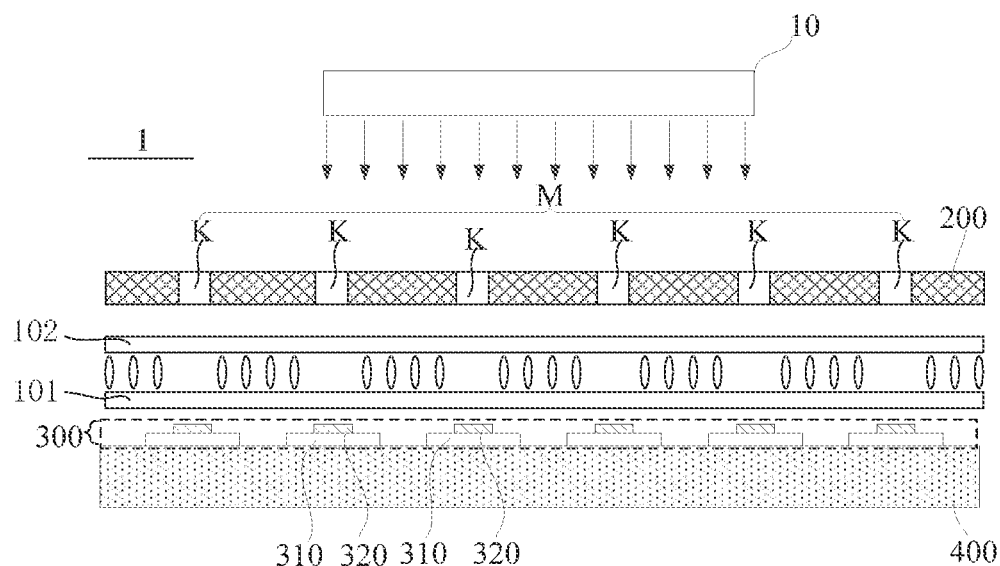
FIG. 5 is a sectional view illustrating a structure of a display panel, in accordance with some other embodiments.

In a case where the display panel 1 is the liquid crystal display panel, the display layer 100 may include a pixel electrode layer, a common electrode layer, a liquid crystal layer, and a circuit layer coupled to the pixel electrode layer. The circuit layer may include a plurality of gate lines, a plurality of data lines, and a plurality of thin film transistors coupled to the gate lines and the data lines, and one thin film transistor is coupled to one pixel electrode in the pixel electrode layer. As shown in FIG. 5, the liquid crystal display panel may further include a first base substrate 101 and a second base substrate 102 that sandwich the display layer, both of which may include a glass substrate, and the first base substrate 101 is further away from the display side of the display layer 100. The photosensitive layer 300 may be disposed between the display layer 100 and the first base substrate 101, or may be disposed on a side of the first base substrate 101 away from the display layer 100. As shown in FIG. 5, a case where the photosensitive layer 300 is disposed on the side of the first base substrate 101 away from the display layer is shown.

Figure 6:
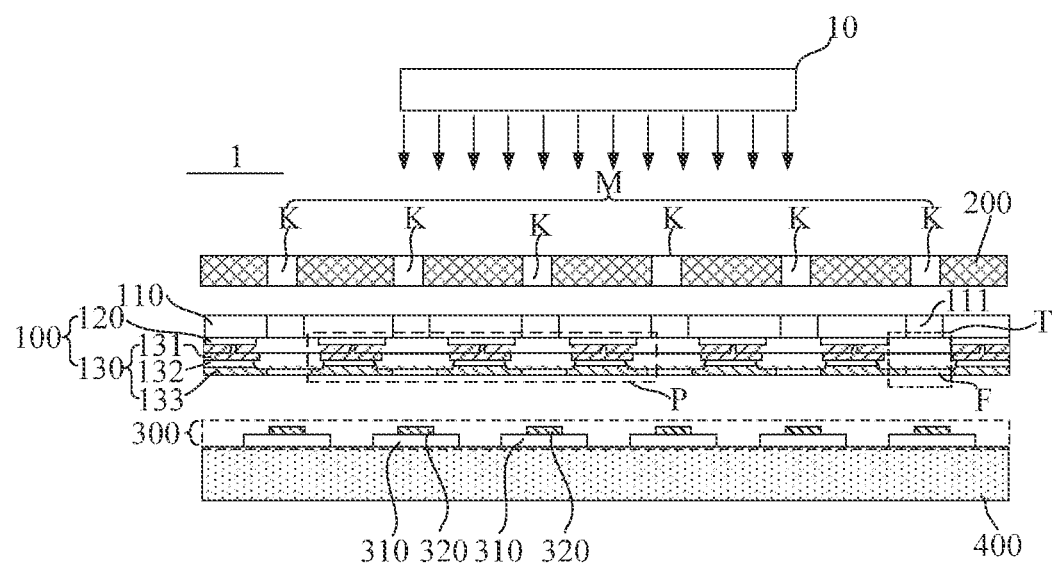
FIG. 6 is a sectional view illustrating a structure of a display panel, in accordance with some other embodiments.
Figure 7A:
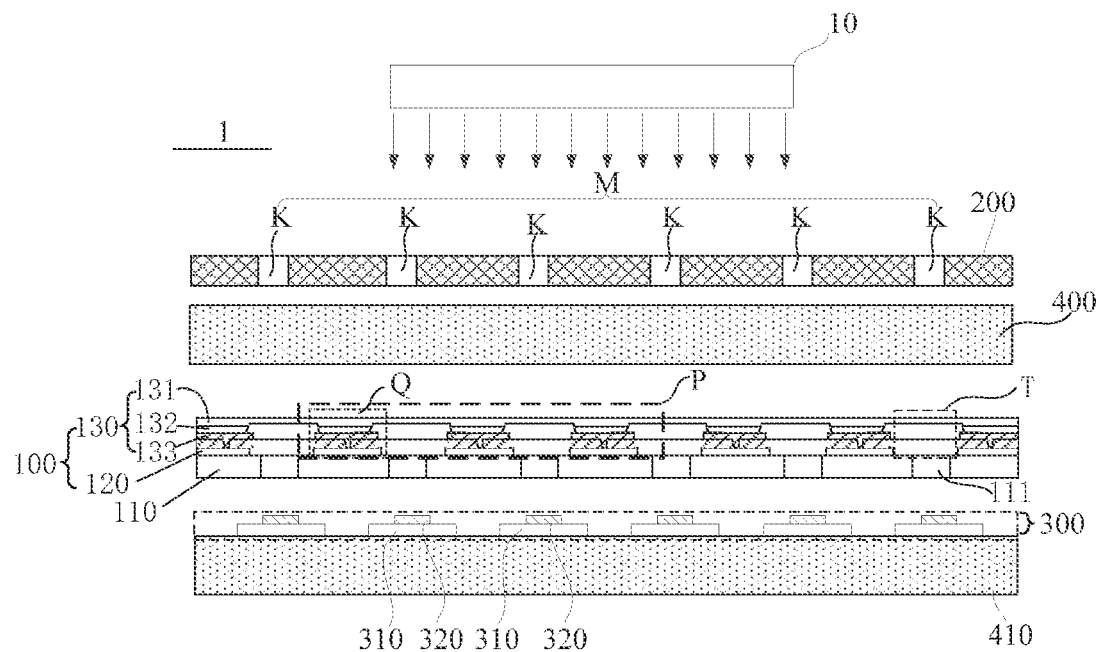
FIG. 7A is a sectional view illustrating a structure of a display panel, in accordance with some other embodiments.
Figure 7B:
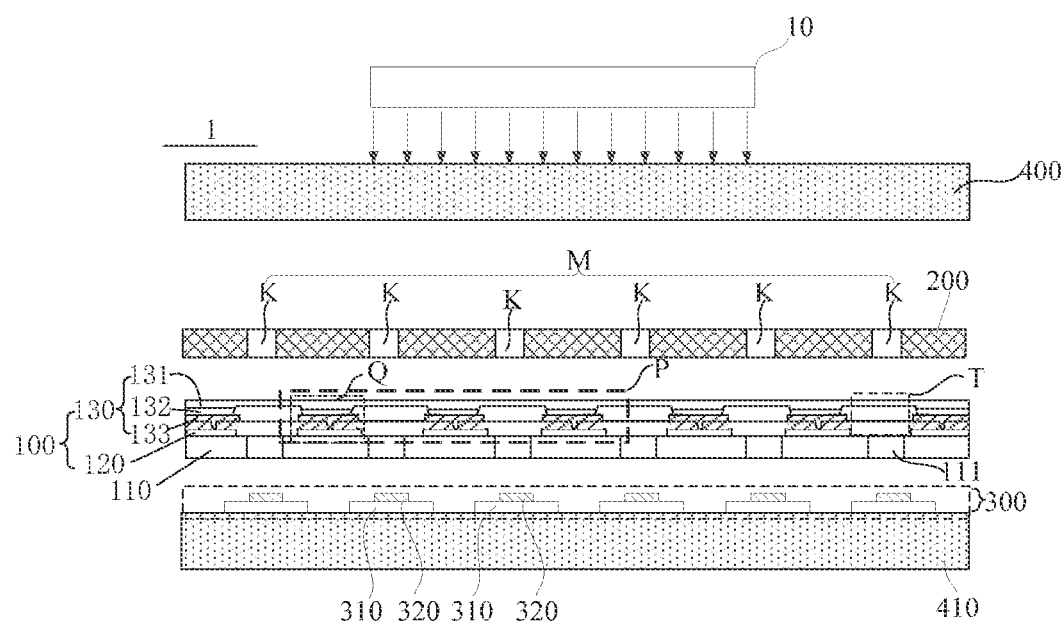
FIG. 7B a sectional view illustrating a structure of a display panel, in accordance with some other embodiments.

In a case where the display panel 1 is the self-luminescent display panel, as shown in FIGS. 6, 7A and 7B, the display layer 100 includes a driving circuit layer 120 (including a plurality of pixel driving circuits) and a light-emitting layer 130 that are stacked, Each pixel driving circuit may have a structure of 7T1C, 6T1C, 4T1C or the like. As shown in FIG. 6, the light-emitting layer 130 includes a plurality of pixel units P, and the driving circuit layer 120 is coupled to the plurality of pixel units P and is configured to drive the plurality of pixel units P to emit light. For example, the plurality of pixel units P are arranged in an array. In some other embodiments, as shown in FIG. 1, each pixel unit P includes a plurality of sub-pixel units, which may be a red sub-pixel unit R, a green sub-pixel unit G, and a blue sub-pixel unit B.

In fact, each sub-pixel unit in the light-emitting layer 130 is correspondingly connected to a driving circuit switch (e.g., a driving transistor) in a pixel driving circuit in the display layer 100, so as to achieve separate control of the sub-pixel unit to display an image as required.

Depending on whether the light-emitting layer 130 in the display layer 100 is arranged proximate to the photosensitive layer 300 or the driving circuit layer 120 in the display layer 100 is arranged proximate to the photosensitive layer 300, there are two possible cases.

In a first case, as shown in FIG. 6, the light-emitting layer 130 is closer to the photosensitive layer 300 than the driving circuit layer 120. In this case, the light-emitting layer 130 sequentially includes a first electrode layer 131, a light-emitting functional layer 132, and a second electrode layer 133 in a direction gradually proximate to the photosensitive layer 300. The second electrode layer 133 is capable of reflecting light, and openings F are formed in regions occupied by the light-transmitting portions T in the second electrode layer 133.

That is, the display panel 1 is a bottom-emission display panel. In this case, the first electrode layer 131 may be a transparent electrode layer (capable of transmitting the visible light), and the second electrode layer 133 may be a metal electrode layer (incapable of transmitting the infrared light). By forming the openings F in the regions occupied by the light-transmitting portions T in the second electrode layer 133, the display layer 100 may transmit the infrared light in the light-transmitting portions T.

In this case, as shown in FIG. 6, the display panel 1 further includes an encapsulation substrate 400, and the encapsulation substrate 400 is disposed on a side of the photosensitive layer 300 away from the display layer 100. The encapsulation substrate 400 can protect an internal structure of the display panel 1. For example, the encapsulation substrate 400 may encapsulate the photosensitive layer 300, protect the photosensitive layer 300, and improve a product quality and a service life. Furthermore, the encapsulation substrate 400 can also be used as a support substrate, and related components such as photosensitive layer driving circuits 310 are disposed on the encapsulation substrate 400. In addition, for an entire display layer 100, the photosensitive layer 300 and the display layer 100 can share the same encapsulation substrate 400, which can simplify the structure.

In a second case, as shown in FIGS. 7A and 7B, the driving circuit layer 120 is closer to the photosensitive layer 300 than the light-emitting layer 130. In this case, the light-emitting layer 130 still sequentially includes the first electrode layer 131, the light-emitting functional layer 132, and the second electrode layer 133 in the direction gradually proximate to the photosensitive layer 300. The second electrode layer 133 is capable of reflecting light, and what is different from the first case is that the display panel 1 is a top-emission display panel. In this case, the first electrode layer 131 is a transparent electrode layer, although the first electrode layer 131 is entirely covered on a base substrate, it is capable of transmitting light, and the second electrode layer 133 is block-shaped and is disposed in regions where the sub-pixels are located. Therefore, there is no need to provide the openings F in the first electrode layer 131 and the second electrode layer 133 to achieve the light transmission as in the first case. That is, the top-emission display panel itself is a structure capable of transmitting light.

In this case, as shown in FIG. 7A, the display panel 1 further includes the encapsulation substrate 400, and the encapsulation substrate 400 is disposed between the infrared mask 200 and the display layer 100; or as shown in FIG. 7B, the encapsulation substrate 400 is disposed on a side of the infrared mask 200 away from the display layer 100.

It can also ensure that the display layer 100 is structurally protected, and in a case where the encapsulation substrate 400 is disposed on the side of the infrared mask 200 away from the display layer 100, the infrared mask 200 can also be protected. In a case where the encapsulation substrate 400 is disposed between the infrared mask 200 and the display layer 100; the encapsulation substrate 400 can also be used as a support substrate, and the infrared mask 200 is formed on the encapsulation substrate 400.

In this case, in some other embodiments, as shown in FIGS. 7A and 73, the display panel 1 may further include a support substrate 410; and the support substrate 410 is disposed on a side of the photosensitive layer 300 away from the display layer 100, and is configured to support the photosensitive layer 300, which facilitates to form the photosensitive layer 300.

The support substrate 410 may be, for example, a glass substrate.

In some embodiments; the display panel 1 is the self-luminescent display panel. For example, the display panel is the OLED display panel, and in this case; the display layer 100 is an organic electroluminescent display layer. After being provided with the photosensitive layer 300, the OLED display panel with the above characteristics can be made lighter and thinner, and the structure is simpler. In yet some embodiments, as shown in FIG. 6, the photosensitive layer 300 includes the photosensitive layer driving circuits 310 and a plurality of photosensitive elements 320, and the photosensitive elements 320 are coupled to the photosensitive layer driving circuits 310. For example, the plurality of photosensitive elements 320 may be arranged in an array. An orthographic projection of each photosensitive element 320 on the light-emitting layer 130 is located between two adjacent pixel units P, or each pixel unit P includes a plurality of sub-pixel units. As shown in FIGS. 7A and 7B, the orthographic projection of the photosensitive element 320 on the light-emitting layer 130 is located between two adjacent sub-pixel units Q.

In order to better enable the photosensitive element 320 to receive the infrared light passing through the display layer 100, influence of the display layer 100 on the infrared light should be minimized. Therefore, if the photosensitive element 320 is disposed between two adjacent pixel units P or between two adjacent sub-pixel units, there is no need to specially set the region of the front camera, and a large screen-to-body ratio is achieved. In addition, compared with providing the camera in a special region, by distributing the photosensitive elements 320 in an entire screen, an image located in the entire screen can be obtained, and it is possible to avoid a problem of an imaging dead region due to that only an image in a region where the photosensitive elements 320 are located can be obtained caused by concentration of the photosensitive elements 320.

It will be noted that, in order to enable the plurality of photosensitive elements 320 to sufficiently receive the infrared light, optionally, regions where the plurality of photosensitive elements 320 are located should cover the hollowed-out regions K. According to that the hollowed-out regions K may include a plurality of holes, it will be seen that the plurality of photosensitive elements 320 should cover all the holes. Herein, the number of the photosensitive elements 320 is not specifically limited. One photosensitive element may correspond to one hole, or one photosensitive element may correspond to a plurality of holes.

It will also be noted that in practical applications, since the photosensitive layer 300 is disposed on a side of the display layer 100 away from a light-exit side of the display layer 100, and certain components in the display layer 100 also emit infrared light, when the photosensitive layer 300 receives the infrared light passing through the hollowed-out regions K and the light-transmitting portions T, it also receives the infrared light emitted by these components. However, since the infrared light is specific or changes are known, it is not necessary to filter out the infrared light, and corresponding influence may be eliminated through related operations in subsequent calculation processing.

Figure 8:
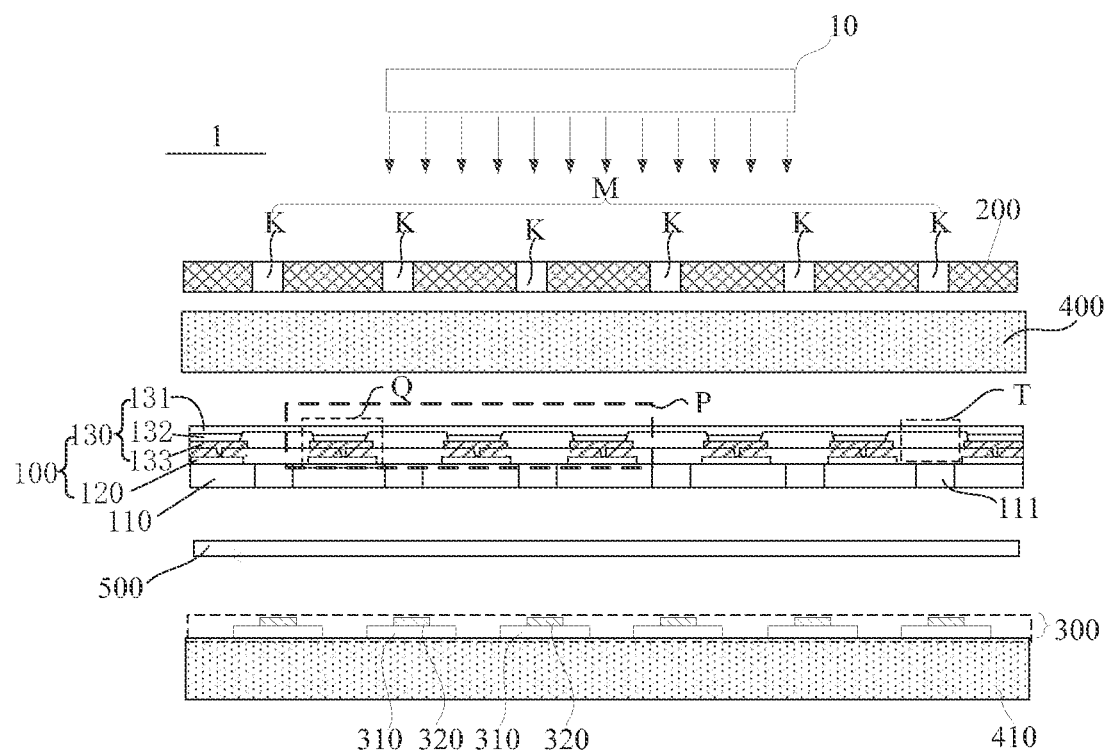
FIG. 8 is a sectional view illustrating a structure of a display panel, in accordance with some other embodiments.

In some embodiments, as shown in FIG. 8, the display panel 1 further includes a filter film 500, and the filter film 500 is disposed between the photosensitive elements 320 and the display layer 100, and is used to filter out the visible light emitted by the display layer 100. By providing the filter film 500, the visible light emitted by the display layer 100 may be physically filtered out or greatly reduced, so that the influence of the visible light emitted by the display layer 100 can be eliminated during the image processing, and the image processing efficiency can be improved.

Figure 9:
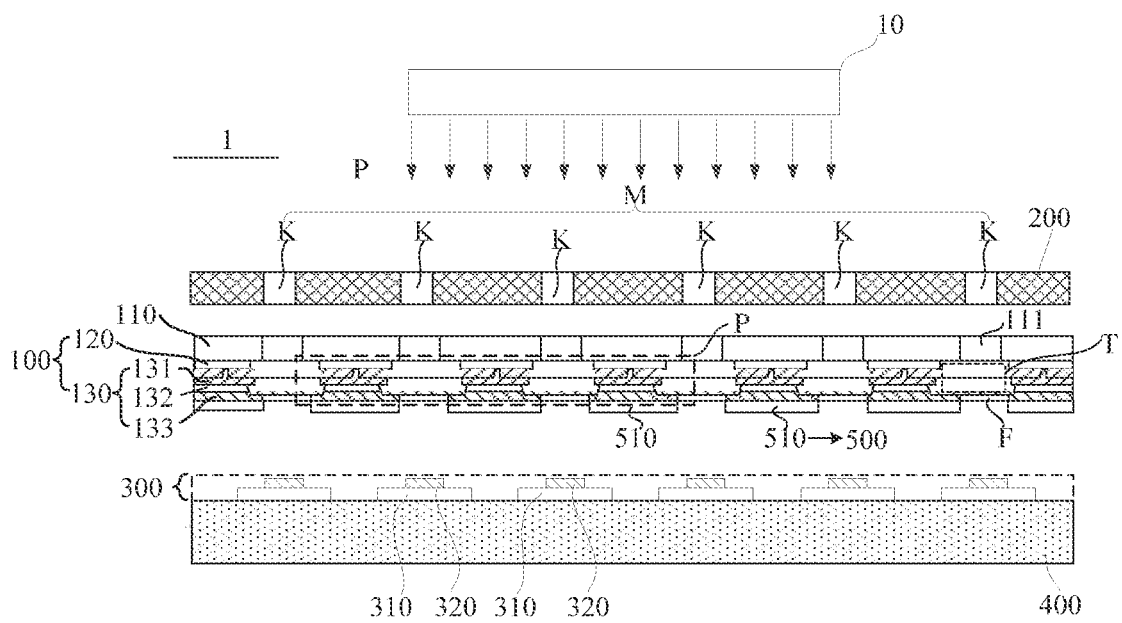
FIG. 9 is a sectional view illustrating a structure of a display panel, in accordance with some other embodiments.

In some other embodiments, as shown in FIG. 9, the filter film 500 may also be directly disposed in the display layer 100. For example, the filter film 500 may be disposed below the pixel units P, the filter film 500 may include a plurality of filter patterns 510, and each pixel unit P is provided with a filter pattern 510 therebelow.

It will also be noted that in these embodiments, the specific structure of the display panel is described by taking an example in which the display panel 1 is the self-luminescent display panel, and a person skilled in the art can understand that, all the above examples of the photosensitive layer 300 are also applicable to the liquid crystal display panel.

Based on the above structure, in some embodiments, as shown in FIGS. 6, 7A and 7B, the display panel 1 further includes a transparent substrate 110, and the substrate 110 is configured to support the display layer 100. The substrate 110 and the display layer 100 together constitute a display backplane.

In this case, in a case where the display panel 1 further includes the driving circuit layer 120 and the light-emitting layer 130, the substrate 110 is disposed on a side of the driving circuit layer 120 away from the light-emitting layer 130; and light-transmitting holes 111 are formed in regions corresponding to the light-transmitting portions T in the substrate 110, an orthogonal projection of each light-transmitting hole 111 on the display layer 100 is within a region occupied by a corresponding light-transmitting portion T; and a region occupied by each photosensitive element 320 in the photosensitive layer 300 is within a range of an orthogonal projection of a light-transmitting hole 111 on the photosensitive layer 300. For example, positions of the light-transmitting holes 111 may be in one-to-one correspondence with positions of the photosensitive elements 320. In a case where the plurality of photosensitive elements 320 are arranged in an array, the light-transmitting holes 111 are arranged in the substrate 110 in a form of a hole array, which can reduce difficulty of a manufacturing process. An arrangement density and sizes of diameters of the light-transmitting holes 111 may be adjusted according to actual needs, as long as the light-transmitting holes are capable of sufficiently transmitting the infrared light. Moreover, since the positions of the light-transmitting holes 111 correspond to the positions of the photosensitive elements 320, it is also possible to ensure that the photosensitive elements 320 sufficiently receive the infrared light passing through the display layer 100.

Of course, it will be noted that, in these embodiments, the photosensitive elements 320 and the pixel units P are not in a same plane, which enables the photosensitive elements 320 to receive the infrared light at a maximum angle.

Figure 10:
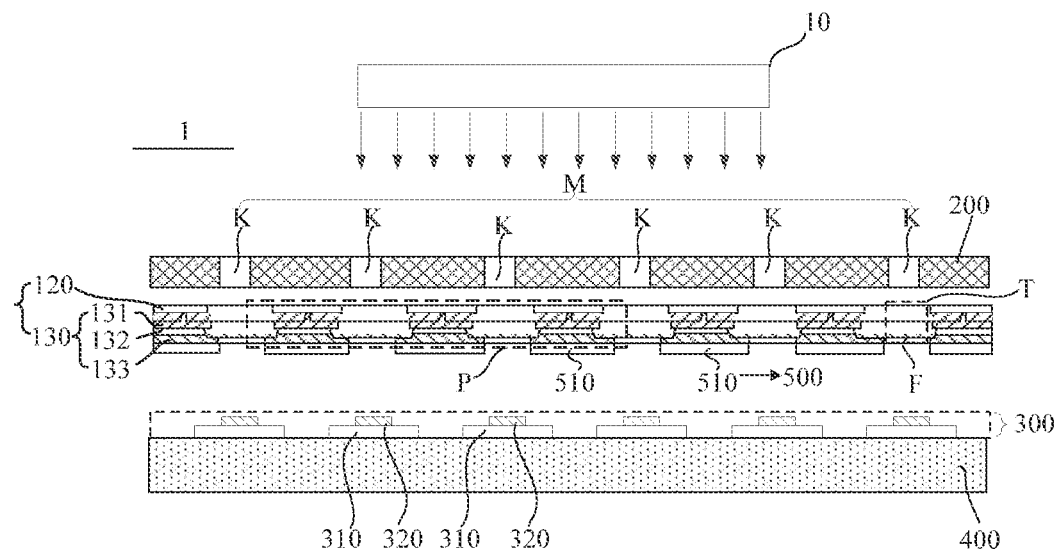
FIG. 10 is a sectional view illustrating a structure of a display panel, in accordance with some other embodiments.

In some other embodiments, as shown in FIG. 10, the infrared mask 200 is configured to support the display layer 100. That is, the infrared mask 200 may be used as the substrate of the display panel 1.

In some embodiments, the photosensitive elements 320 are complementary metal oxide semiconductor (CMOS) sensors, charge-coupled devices (CCDs), or organic photosensitive sensors (OPSs), The CMOS sensors, the CCDs, and the OPSs are all capable of collecting the infrared light well.

Figure 11:
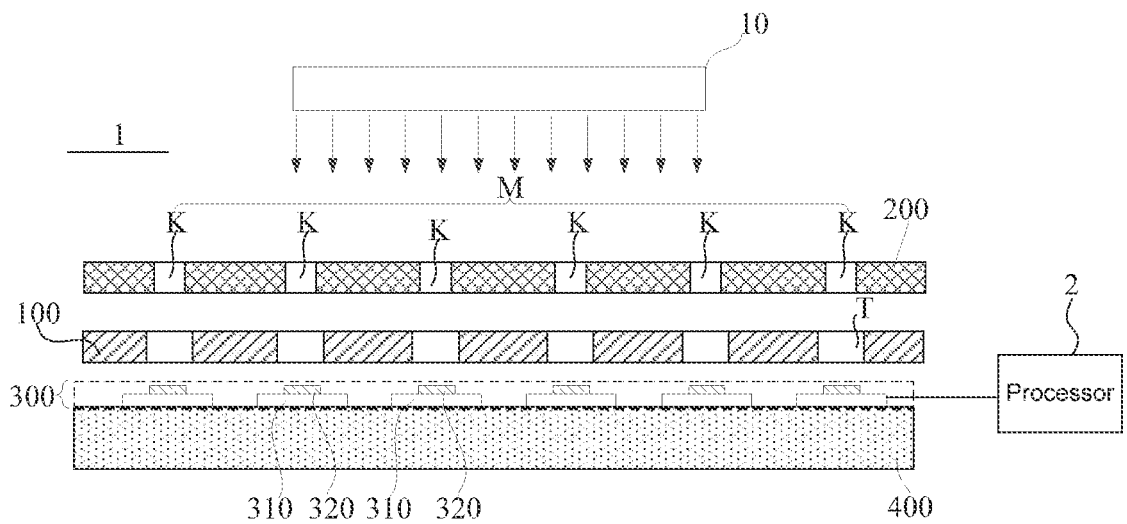
FIG. 11 is a schematic diagram illustrating a structure of an electronic device, in accordance with some embodiments.

Some embodiments of the present disclosure provide an electronic device. As shown in FIG. 11, the electronic device includes a processor 2 and the above display panel 1. The processor 2 is coupled to the photosensitive layer 300, and is configured to determine the image data of the object to be photographed 10 emitting the infrared light according to the image signal and the image data of the preset pattern.

The electronic device may be, for example, a smart phone, a tablet computer, an outdoor electronic display screen, or an ATM machine, which may all include the display panel provided by these embodiments.

The processor 2 may be a computer chip with logical operation and mathematical operation functions such as a central processing unit (abbreviated as CPU) or a graphics processing unit (GPU), and is used to execute executable program codes, such as computer programs, to run programs corresponding to the executable codes.

The electronic device provided by the embodiments of the present disclosure has same beneficial technical effects as the display panel 1 provided by the embodiments of the present disclosure, and details will not be repeated herein.

Figure 12:
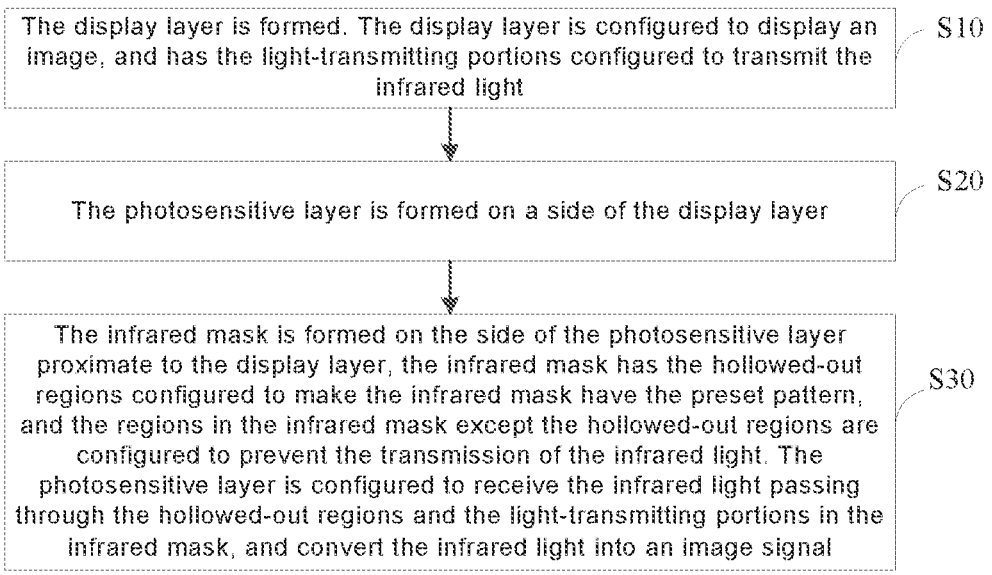
FIG. 12 is a flow diagram of a method for manufacturing a display panel, in accordance with some embodiments.

Some embodiments of the present disclosure provide a method for manufacturing the display panel 1. As shown in FIG. 12, the method includes the following steps.

In S10, the display layer 100 is formed. The display layer 100 is configured to display an image, and has the light-transmitting portions T configured to transmit the infrared light.

According to that the display panel 1 may be the liquid crystal display panel or the self-luminescent display panel, the display layer 100 may be formed according to actual conditions.

Figure 13:
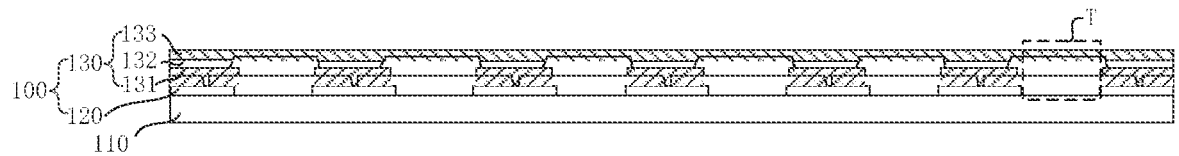
FIG. 13 is a diagram illustrating a structure in which a driving circuit layer and a light-emitting layer are formed on a substrate, in accordance with some embodiments.

Taking the example in which the display panel 1 is the self-luminescent display panel, in a case where the display panel 1 further includes the transparent substrate 110, the step of forming the display layer 100 may include: as shown in FIG. 13, forming the driving circuit layer 120 and the light-emitting layer 130 on the substrate 110.

The driving circuit layer 120 may be formed through a patterning process (e.g., a gate metal layer (including gate lines and gates of thin film transistors), a source-drain metal layer (including data lines and sources and drains of the thin film transistors) and active layers of the thin film transistors) may be formed through patterning processes). The light-emitting layer 130 includes the second electrode layer 133, the light-emitting functional layer 132 and the first electrode layer 131 that are sequentially arranged in a direction gradually away from the substrate 110.

In a case where the display panel 1 is the bottom-emission display panel, the first electrode layer 131, the light-emitting functional layer 132, and the second electrode layer 133 may follow existing manufacturing processes, but a difference is that the openings F need to be provided in the second electrode layer 133 to form the light-transmitting portions T, so that the external infrared light can pass through the display layer 100 through the light-transmitting portions T and reach the photosensitive layer 300.

In a case where the display panel 1 is the top-emission display panel, the first electrode layer 131, the light-emitting functional layer 132, and the second electrode layer 133 may follow the existing manufacturing processes.

In some embodiments, the display panel 1 is the bottom-emission display panel.

In S20, the photosensitive layer 300 is formed on a side of the display layer 100. The photosensitive layer 300 may be formed by using various methods.

For example, taking an example in which the display panel 1 is the bottom-emission display panel, in a case where the display panel 1 further includes the encapsulation substrate 400, the step of forming the photosensitive layer 300 on a side of the display layer 100 may include the following steps.

Figure 14:
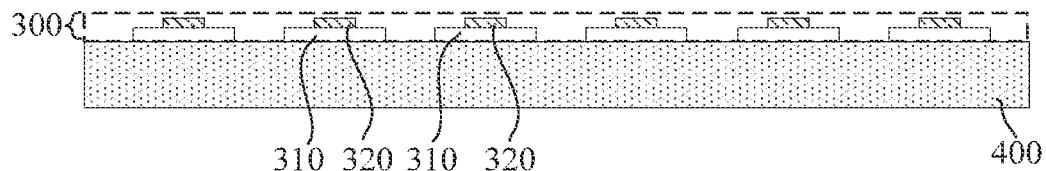
FIG. 14 is a diagram illustrating a structure in which photosensitive elements are formed on an encapsulation substrate, in accordance with some embodiments.

In S201, as shown in FIG. 14, the photosensitive layer 300 is formed on the encapsulation substrate 400. The photosensitive layer 300 includes the photosensitive layer driving circuits 310 and the plurality of photosensitive elements 320, and the photosensitive layer driving circuits 310 are coupled to the plurality of photosensitive elements 320.

Depending on different types of the photosensitive elements 320, specific manufacturing methods are also different.

Figure 15:
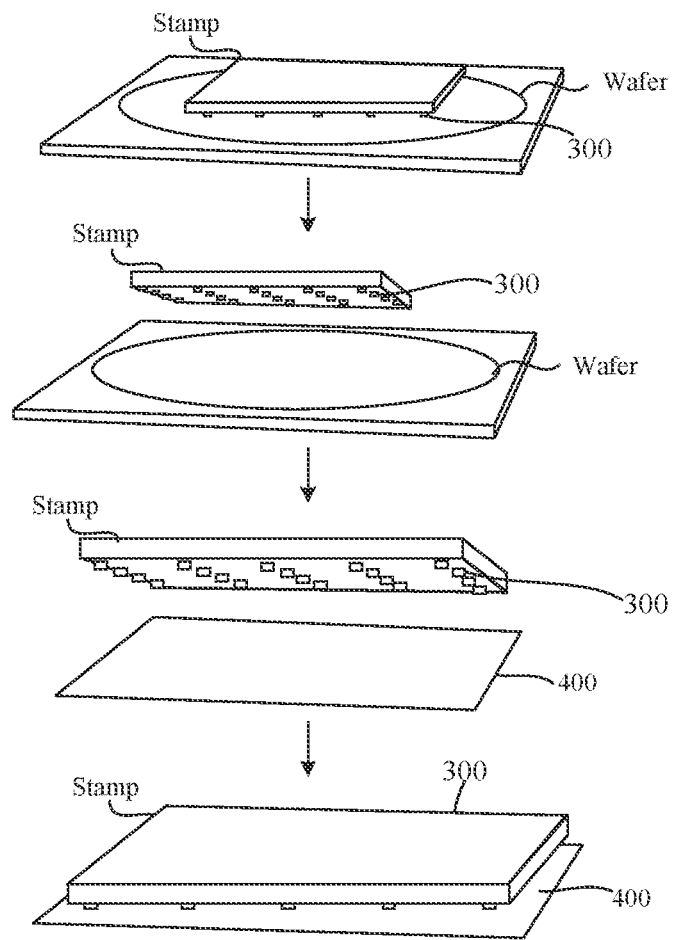
FIG. 15 is a flow diagram of forming a photosensitive layer on an encapsulation substrate, in accordance with some embodiments.

In a case where each photosensitive element 320 is a CMOS sensor or a COD, as shown in FIG. 15, the step of forming the photosensitive layer 300 on the encapsulation substrate 400 may include:
forming the photosensitive layer 300 on a wafer;
transferring the photosensitive layer 300 to a surface of a stamp; and
transferring the photosensitive layer 300 on the surface of the stamp to the encapsulation substrate 400.

That is, the photosensitive layer 300 is transferred to the encapsulation substrate 400 through a transfer method, which may be divided into two parts: pick-up and transfer; and has a high transfer accuracy.

The photosensitive layer 300 specifically includes the photosensitive layer driving circuits 310 and the photosensitive elements 320. The photosensitive layer driving circuits 310 and the photosensitive elements 320 are both fabricated on the wafer; and may be aligned with the encapsulation substrate 400 in advance during the transfer, so as to achieve accurate transfer of the photosensitive layer 300 to a corresponding position of the encapsulation substrate 400. For example, the photosensitive elements 320 may be the CMOS sensors, so that integrated transfer of the photosensitive elements 320 and the photosensitive layer driving circuits 310 may be achieved.

In a case where each photosensitive element 320 is an OPS, the step of forming the photosensitive layer 300 on the encapsulation substrate 400 may include the following steps.

The photosensitive layer driving circuits 310 are formed on the encapsulation substrate 400.

For example, the photosensitive layer driving circuits 310 may be formed through a patterning process. Specific manufacturing processes may follow existing manufacturing processes of the driving circuit layer 120 in the display panel, and details will not be repeated herein.

The plurality of photosensitive elements 320 are formed on the encapsulation substrate 400 on which the photosensitive layer driving circuits 310 have been formed; and each photosensitive element 320 includes electrode layer(s) and an organic photosensitive layer.

According to different stacked structures of the electrode layer(s) and the organic photosensitive layer in the photosensitive element 320, there may be two possible implementations for the step of forming the plurality of photosensitive elements 320 on the encapsulation substrate 400 on which the photosensitive layer driving circuits 310 have been formed.

In a first implementation, a plurality of anodes and a plurality of cathodes are formed on the encapsulation substrate 400; and the organic photosensitive layer (which may include a plurality of organic photosensitive patterns) is formed on the encapsulation substrate 400 on which the plurality of anodes and the plurality of cathodes have been formed, and each organic photosensitive pattern is coupled to an anode and a cathode.

In a second implementation, an electrode layer is formed on the encapsulation substrate 400; the organic photosensitive layer (which may include a plurality of organic photosensitive patterns) is formed on the encapsulation substrate 400 on which the electrode layer (which may include a plurality of anodes) has been formed; and another electrode layer (which may include a plurality of cathodes) is formed on the encapsulation substrate 400 on which the organic photosensitive layer has been formed. An anode, a cathode, and an organic photosensitive pattern located between the anode and the cathode constitute a photosensitive element 320. Taking an example in which the photosensitive element 320 is an organic photosensitive diode (OPD), a structure of each OPD from top to bottom includes a cathode, an organic photosensitive pattern, and an anode.

Taking the first implementation as an example, the encapsulation substrate 40 may be encapsulation glass, and after the photosensitive layer driving circuits 310 (which may include thin film transistors (TFTs)) are fabricated on the encapsulation glass, the above electrode layer (e.g., the plurality of anodes and the plurality of cathodes) may be reserved on the TFT backplane circuits to facilitate contact with the organic photosensitive patterns. Then, organic photosensitive patterns may be coated on the encapsulation substrate 400, so that each organic photosensitive pattern is in contact with an anode and a cathode. In this way, the photosensitive layer 300 may be formed.

Figure 16:
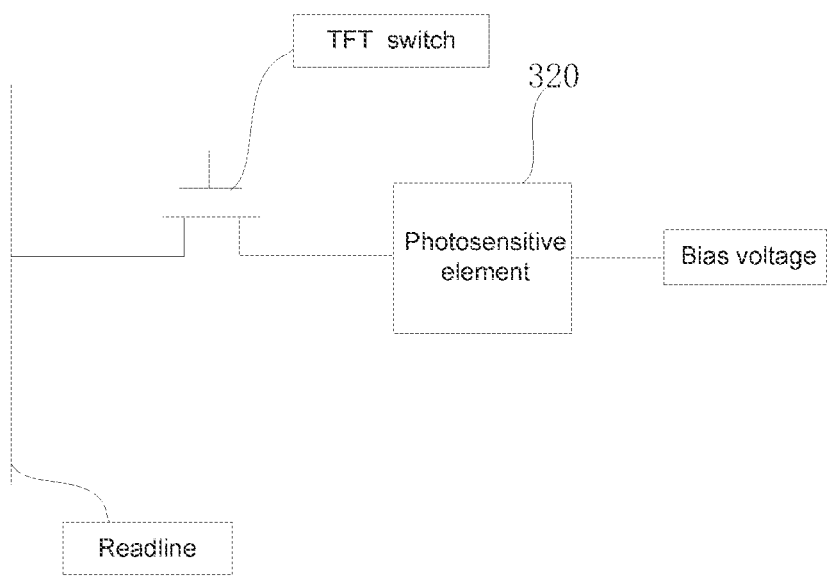
FIG. 16 is a schematic diagram showing a circuit principle of a photosensitive element, in accordance with some embodiments.

Taking an example in which the photosensitive element 320 is the CMOS sensor, as shown in FIG. 16, each photosensitive element 320 corresponds to a TFT switch, the photosensitive element in the figure may be a photosensitive element such as a diode, a triode, or a photosensitive resistor, and one terminal of the photosensitive element is connected to the TFT switch, and the other terminal is connected to a bias voltage. Of course, a form of a single photosensitive element is not limited, and the TFT switch may not be used, and only one photosensitive element 320 is included. In this case, corresponding lead and detection circuit support is needed. This is known to a person skilled in the art and will not be repeated herein. Readline is a reading line, and is used to read an image signal acquired by the photosensitive element 320.

In actual work, as shown in FIG. 17, taking an example in which the photosensitive layer 300 includes a plurality of photosensitive elements 320 arranged in an array, the plurality of photosensitive elements 320 may be scanned row by row by using row scanning gate lines (Gateline). When a gate line of a certain row is scanned, TFT switches of this row are turned on, and then the processor 2 acquires signals of corresponding photosensitive elements 320 through reading lines. When all rows are scanned, complete image data of a frame may be obtained, and the image may be recovered through processing by the processor 2.

In S202, the encapsulation substrate 400 is attached to the display layer 100. The photosensitive element 320 is closer to the display layer 100 than the encapsulation substrate 400, and an orthogonal projection of each photosensitive element 320 on the display layer 100 is within a region where a corresponding light-transmitting portion is located.

In a process of attaching the encapsulation substrate 400 to the display layer 100, the photosensitive elements 320 formed on the encapsulation substrate 400 and the display layer 100 may be aligned, so that the orthogonal projection of each photosensitive element 320 on the display layer 100 is within a region where a corresponding light-transmitting portion T is located to receive infrared light passing through the light-transmitting portion T.

In S30, the infrared mask 200 is formed on the side of the photosensitive layer 300 proximate to the display layer 100. The infrared mask 200 has the hollowed-out regions K with the preset pattern M, and the region in the infrared mask 200 except the hollowed-out regions K is configured to prevent the transmission of the infrared light. The photosensitive layer 300 is configured to receive the infrared light passing through the hollowed-out regions K in the infrared mask 200 and the light-transmitting portions T, and convert the infrared light into an image signal.

The infrared mask 200 may be separately formed. That is, the infrared mask 200 is formed under support of another foreign substrate, after the fabrication is completed, the infrared mask 200 is separated from the foreign substrate, and then the infrared mask 200 is attached to the display layer 100 and/or the photosensitive layer 300, so that the infrared mask 200 is formed on the side of the photosensitive layer 300 proximate to the display layer 100. It may also be formed under support of the substrate 110 described above. Both cases are applicable to the case where the display panel includes the substrate 110. In addition, the mask plate that prevents the transmission of the infrared light may also be used as a support plate, and the display layer 100 is formed on the support plate, and then the mask plate is etched to form the infrared mask. This case is a case where the infrared mask is configured to support the display layer 100.

In the case where the display panel 1 includes the substrate 110 for supporting the display layer 100, since the infrared mask 200 and the display layer 100 are both formed with the substrate 110 as a support substrate, in this case, there is no strict execution sequence for forming the infrared mask 200 and forming the display layer 100. The infrared mask 200 may be formed before the display layer 100, or the display layer may be formed before the infrared mask. Moreover, since the photosensitive layer 300 is formed on the encapsulation substrate 400, the step of attaching the encapsulation substrate 400 to the display layer 100 may occur after the display layer 100 is formed, or after the infrared mask 200 is formed, or after the display layer 100 and infrared mask are formed.

In the case where the infrared mask 200 is configured to support the display layer 100, an execution sequence is: first fabricating the mask plate that prevents the transmission of the infrared light, then forming the display layer 100, and then performing the steps of forming the infrared mask 200 and attaching the encapsulation substrate 400 to the display layer 100.

The method for manufacturing the display panel 1 provided by the embodiments of the present disclosure has same beneficial technical effects as the display panel 1 provided by the embodiments of the present disclosure, and details will not be repeated herein.

Some embodiments of the present disclosure provide an imaging method for the above electronic device, i.e., a lensless imaging method. As shown in FIG. 18, the method includes the following steps.

In S100, power is supplied to the photosensitive layer 300 in the display panel 1, so that the photosensitive layer 300 receives the infrared light emitted by the object to be photographed 10 and passing through the hollowed-out regions K and the light-transmitting portions T, and converts the infrared light into an image signal and outputs the image signal.

The infrared light is emitted by the object to be photographed 10 outside the display panel, and enters the display panel 1. Since the display layer 100 in the display panel 1 is provided with the light-transmitting portions T capable of transmitting the infrared light, the infrared light enters the display panel 1. In a case where the infrared mask 200 and the photosensitive layer 300 are disposed on a same side of the display layer 100, the infrared light first passes through the light-transmitting portions of the display layer 100, and then passes through the hollowed-out regions K of the infrared mask 200, and is received by the photosensitive layer 300. In a case where the infrared mask 200 and the photosensitive layer 300 are disposed on both sides of the display layer 100, the infrared light first passes through the hollowed-out regions K of the infrared mask 200, and then passes through the light-transmitting portions T in the display layer 100, and is received by the photosensitive layer 300.

After receiving the infrared light, the photosensitive layer 300 converts the infrared light into an image signal that can be processed by the processor 2.

According to the above lensless imaging principle, a special mask (i.e., the infrared mask 200 with the preset pattern) is used to replace the conventional lens to achieve the indirect imaging. Theoretically, during the imaging, part of the infrared light emitted by the object to be photographed 10 is blocked, and infrared light passing through the hollowed-out regions K and the light-transmitting portions T is received by the photosensitive layer 300, and the photosensitive layer 300 converts the infrared light into an image signal. The above process is equivalent to the process of encoding the image of the object to be photographed by using the preset pattern corresponding to the hollowed-out regions K.

Since the hollowed-out regions are configured to make the infrared mask 200 have the preset pattern, part of the infrared light is allowed to pass according to a certain rule, the infrared light originally carrying information of the object, after passing through infrared photoresistors, forms an intermediate image formed by stacking preset patterns of the infrared photoresistors, which corresponds to the infrared light received by the photosensitive layer 300. The infrared mask is equivalent to a standard pattern plate. The infrared light emitted by the object to be photographed 10 forms an intermediate image on the photosensitive layer 300 after passing through the standard pattern plate. The intermediate image contains both image information of the object to be photographed 10 and image information of the standard pattern plate.

The preset pattern herein may be any pattern capable of encoding the image. For example, referring to FIG. 4, it is a pattern capable of encoding with 0 and 1.

Figure 4:
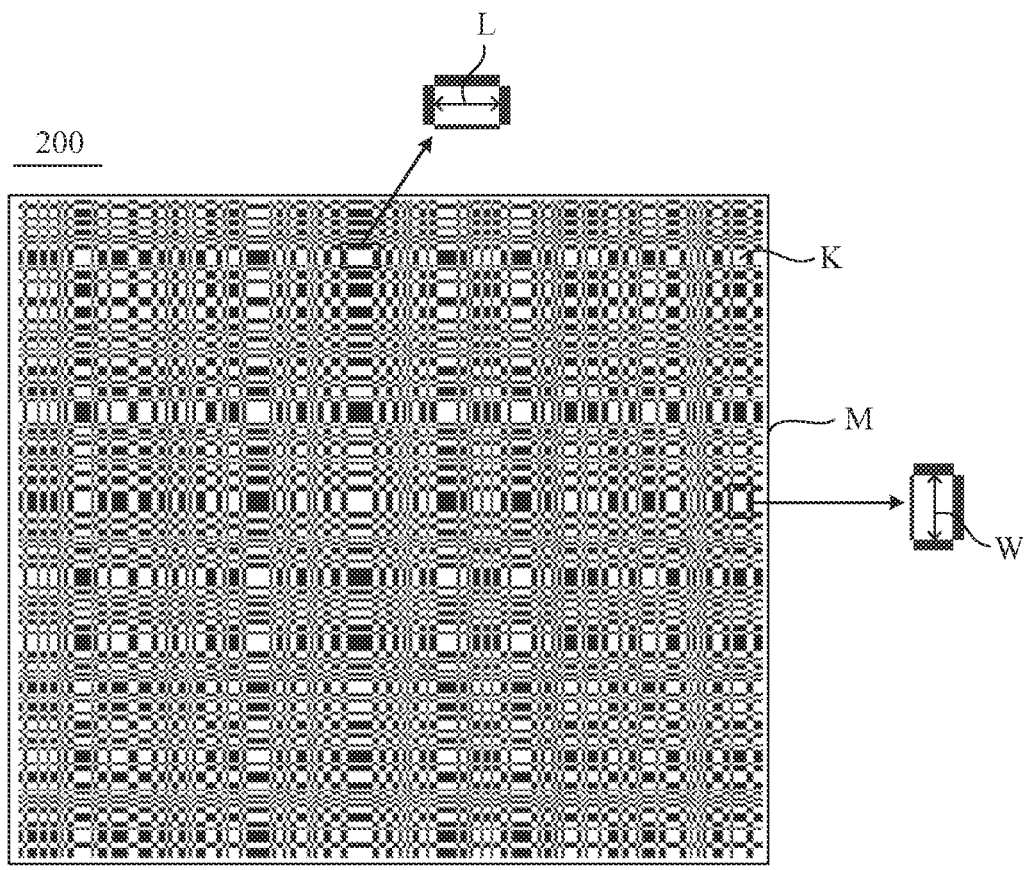
FIG. 4 is a top view illustrating a structure of an infrared mask, in accordance with some embodiments.

As shown in FIG. 4, the above image encoding process may be regarded as the convolution matrix operation, that is, the convolution operation is performed on the image matrix of the object to be photographed 10 by using the mask matrix to obtain the matrix corresponding to the image signal. The mask matrix is a matrix corresponding to the preset pattern, which may be composed of 0 and 1. During the convolution operation, the unmasked 1-valued regions are processed, and the masked 0-valued regions are not included in the calculation. In the present embodiments, the hollowed-out regions K of the infrared mask 200 are the 1-valued regions. Herein, taking the example in which the ratio of the hollowed-out regions K to the region defined by the infrared mask 200 is approximately ⅓, it can be understood that, the hollowed-out regions K may be used to acquire approximately ⅓ of the original image data in the Fourier domain (the image), in which case with a 1-valued region as a pixel, and the value of each pixel in the original image is recalculated (obtaining the intermediate image (i.e., the image signal) based on the mask matrix (also referred to as the kernel or the convolution kernel). A value in the mask matrix (the convolution kernel) defines a value at which a current pixel and adjacent pixels affect a new pixel value. Algorithmically, the image of the object to be photographed 10 itself may be mathematically abstracted into the matrix I (i.e., the image data of the object to be photographed 10), the preset pattern M may be mathematically abstracted into the matrix A (i.e., the image data of the preset pattern), and the intermediate image (i.e., the image signal) may be mathematically abstracted into the matrix Y, and there is a relational expression for the image encoding process and the image decoding process, i.e., $Y=A*I$.

In S200, the image data of the object to be photographed 10 is determined according to the image signal and the image data of the preset pattern.

It may be regarded as the image decoding process that the image data of the object to be photographed 10 is determined according to the image signal and the image data of the preset pattern. Still according to the above relational expression $Y=A*I$, since the image data of the preset pattern M is a known matrix, and Y is also a known matrix, by reconstructing the image signal through inversion, the image of the object to be photographed 10 may be obtained through decoding.

A person skilled in the art will understand that, steps, measures and solutions in various operations, methods and processes that have been discussed in the present disclosure may be alternated, changed, combined, or deleted. Optionally, other steps, measures and solutions in various operations, methods and processes that have been discussed in the present disclosure may also be alternated, changed, rearranged, decomposed, combined, or deleted. Optionally, the steps, measures and solutions in various operations, methods and processes that are disclosed in the present disclosure in the prior art may also be alternated, changed, rearranged, decomposed, combined or deleted.

The forgoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
  a display layer configured to display an image, the display layer having light-transmitting portions, and the light-transmitting portions being configured to transmit infrared light;

a photosensitive layer disposed on a side of the display layer; and an infrared mask disposed on a side of the photosensitive layer proximate to the display layer, the infrared mask having hollowed-out regions configured to make the infrared mask have a preset pattern, and a region in the infrared mask except the hollowed-out regions being configured to prevent transmission of infrared light; the photosensitive layer being configured to receive infrared light passing through the hollowed-out regions and the light-transmitting portions, and convert the infrared light into an image signal;

wherein the display layer includes a driving circuit layer and a light-emitting layer that are stacked, the light-emitting layer includes a plurality of pixel units, and the driving circuit layer is coupled to the plurality of pixel units and is configured to drive the plurality of pixel units to emit light.

2. The display panel according to claim 1, wherein orthogonal projections of the hollowed-out regions on the display layer are located within regions occupied by the light-transmitting portions.

3. The display panel according to claim 1, wherein the photosensitive layer is disposed on a side of the display layer away from a display side of the display layer.

4. The display panel according to claim 1, wherein the infrared mask is disposed on a side of the display layer away from the photosensitive layer, or the infrared mask is disposed between the display layer and the photosensitive layer.

5. The display panel according to claim 1, wherein the light-emitting layer is closer to the photosensitive layer than the driving circuit layer;

the light-emitting layer includes a first electrode layer, a light-emitting functional layer and a second electrode layer that are sequentially arranged in a direction gradually proximate to the photosensitive layer, the second electrode layer is capable of reflecting light, and openings are formed in regions, occupied by the light-transmitting portions, in the second electrode layer; and the display panel further comprises an encapsulation substrate, and the encapsulation substrate is disposed on a side of the photosensitive layer away from the display layer.

6. The display panel according to claim 1, wherein the photosensitive layer includes photosensitive layer driving circuits and a plurality of photosensitive elements, and the plurality of photosensitive elements are coupled to the photosensitive layer driving circuits;

an orthographic projection of each photosensitive element on the light-emitting layer is located between two adjacent pixel units; or each pixel unit includes a plurality of sub-pixel units, and the orthographic projection of each photosensitive element on the light-emitting layer is located between two adjacent sub-pixel units.

7. The display panel according to claim 6, wherein the plurality of pixel units are arranged in an array, and the plurality of photosensitive elements are arranged in an array.

8. The display panel according to claim 6, wherein the photosensitive elements are complementary metal oxide semiconductor sensors, charge-coupled devices, or organic photosensitive sensors.

9. The display panel according to claim 1, wherein the infrared mask is configured to support the display layer; or the display panel further comprises a transparent substrate, and the substrate is configured to support the display layer.

10. The display panel according to claim 9, wherein the display panel further comprises the substrate, the driving circuit layer, and the light-emitting layer, the substrate is disposed on a side of the driving circuit layer away from the light-emitting layer; and the substrate has light-transmitting holes, an orthogonal projection of each light-transmitting, hole on the display layer is within a region occupied by a corresponding light-transmitting portion, and an orthogonal projection of each photosensitive element on the substrate is within a region where a corresponding light-transmitting hole is located.

11. The display panel according to claim 1, further comprising:

a filter film disposed between the photosensitive layer and the display layer, the filter film being used to filter out visible light emitted by the display layer.

12. The display panel according to claim 1, wherein the infrared mask is a glass layer, a metal layer or an organic material layer.

13. An electronic device, comprising:

a processor; and the display panel according to claim 1, wherein the processor is coupled to the photosensitive layer, and is used to determine image data of an object to be photographed emitting infrared light according to the image signal and image data of the preset pattern.

14. A method for manufacturing a display panel, the method comprising:

forming a display layer, the display layer being configured to display an image, the display layer having light-transmitting portions configured to transmit infrared light;

forming a photosensitive layer on a side of the display layer; and forming an infrared mask on a side of the photosensitive layer proximate to the display layer, the infrared mask having hollowed-out regions configured to make the infrared mask have a preset pattern, and a region in the infrared mask except the hollowed-out regions being configured to prevent transmission of infrared light, wherein the photosensitive layer is configured to receive infrared light passing through the hollowed-out regions in the infrared mask and the light-transmitting portions, and convert the infrared light into an image signal;

wherein the display panel further includes an encapsulation substrate, forming the photosensitive layer on a side of the display layer includes:

forming the photosensitive layer on the encapsulation substrate, the photosensitive layer including photosensitive layer (hiving circuits and a plurality of photosensitive elements, and the photosensitive layer driving circuits being coupled to the plurality of photosensitive elements; and attaching the encapsulation substrate to the display layer, the photosensitive element being closer to the display layer than the encapsulation substrate, and an orthogonal projection of each photosensitive element on the display layer being within a region where a corresponding light-transmitting portion is located.

15. The method according to claim 14, wherein in a case where each photosensitive element is a complementary metal oxide semiconductor sensor or a charge-coupled device, forming the photosensitive layer on the encapsulation substrate includes:
- forming the photosensitive layer on a wafer;
- transferring the photosensitive layer to a surface of a stamp; and
- transferring the photosensitive layer on the surface of the stamp to the encapsulation substrate.

16. The method according to claim 14, wherein each photosensitive element is an organic photosensitive sensor, forming the photosensitive layer on the encapsulation substrate includes:
- forming the photosensitive layer driving circuits on the encapsulation substrate; and
- forming the plurality of photosensitive elements on the encapsulation substrate on which the photosensitive layer driving circuits have been formed, each photosensitive element including at least one electrode layer and an organic photosensitive layer.

* * * * *

UNITED STATES PATENT AND TRADEMARK OFFICE
CERTIFICATE OF CORRECTION

| | |
|---|---|
| PATENT NO. | : 11,950,484 B2 |
| APPLICATION NO. | : 17/280366 |
| DATED | : April 2, 2024 |
| INVENTOR(S) | : Pengpeng Wang et al. |

It is certified that error appears in the above-identified patent and that said Letters Patent is hereby corrected as shown below:

In the Specification

In Column 4, Line 5, the "," at the end of the sentence is incorrect, it should be a ".".

In the Claims

In Column 20 (Claim 14), Line 54, "(hiving" should be "driving".

Signed and Sealed this
Third Day of December, 2024

Katherine Kelly Vidal
*Director of the United States Patent and Trademark Office*